(12) United States Patent
Cao et al.

(10) Patent No.: US 11,594,612 B2
(45) Date of Patent: Feb. 28, 2023

(54) METAL OXIDE INTERLAYER STRUCTURE FOR NFET AND PFET

(71) Applicant: Taiwan Semiconductor Manufacturing Co., Ltd., Hsin-Chu (TW)

(72) Inventors: Min Cao, Hsinchu (TW); Pei-Yu Wang, Hsinchu (TW); Sai-Hooi Yeong, Hsinchu County (TW); Ching-Wei Tsai, Hsinchu (TW); Kuan-Lun Cheng, Hsinchu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/508,595

(22) Filed: Oct. 22, 2021

(65) Prior Publication Data

US 2022/0045192 A1    Feb. 10, 2022

Related U.S. Application Data

(62) Division of application No. 16/895,436, filed on Jun. 8, 2020, now Pat. No. 11,158,721.

(Continued)

(51) Int. Cl.
| | |
|---|---|
| *H01L 21/00* | (2006.01) |
| *H01L 29/51* | (2006.01) |
| *H01L 21/8238* | (2006.01) |
| *H01L 21/02* | (2006.01) |
| *H01L 27/092* | (2006.01) |
| *H01L 29/66* | (2006.01) |

(Continued)

(52) U.S. Cl.
CPC ........ *H01L 29/516* (2013.01); *H01L 21/0206* (2013.01); *H01L 21/823828* (2013.01); *H01L 21/823857* (2013.01); *H01L 27/092* (2013.01); *H01L 29/42364* (2013.01); *H01L 29/513* (2013.01); *H01L 29/517* (2013.01); *H01L 29/6684* (2013.01); *H01L 29/78391* (2014.09)

(58) Field of Classification Search
CPC ............. H01L 29/516; H01L 29/78391; H01L 21/0206; H01L 21/823828; H01L 21/823857; H01L 27/092; H01L 29/42364; H01L 29/513; H01L 29/517; H01L 29/6684
See application file for complete search history.

(56) References Cited

U.S. PATENT DOCUMENTS

| | | |
|---|---|---|
| 6,664,186 B1 | 12/2003 | Callegari et al. |
| 7,563,730 B2 | 7/2009 | Forbes et al. |

(Continued)

*Primary Examiner* — Richard A Booth
(74) *Attorney, Agent, or Firm* — Haynes and Boone, LLP

(57) ABSTRACT

The present disclosure provides a method of forming a semiconductor device including an nFET structure and a pFET structure where each of the nFET and pFET structures include a semiconductor substrate and a gate trench. The method includes depositing an interfacial layer in each gate trench; depositing a first metal oxide layer over the interfacial layer; removing the first metal oxide layer from the pFET structure; depositing a ferroelectric layer in each gate trench; depositing a second metal oxide layer over the ferroelectric layer; removing the second metal oxide layer from the nFET structure; and depositing a gate electrode in each gate trench.

20 Claims, 11 Drawing Sheets

Related U.S. Application Data

(60) Provisional application No. 62/894,200, filed on Aug. 30, 2019.

(51) Int. Cl.
 *H01L 29/78* (2006.01)
 *H01L 29/423* (2006.01)

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,153,584 B2 * | 10/2015 | Hooker ............ H01L 21/823462 |
| 9,236,267 B2 | 1/2016 | De et al. |
| 9,236,300 B2 | 1/2016 | Liaw |
| 9,520,482 B1 | 12/2016 | Chang et al. |
| 9,567,814 B2 | 2/2017 | Wu et al. |
| 2013/0105901 A1 | 5/2013 | Park |
| 2016/0049510 A1 * | 2/2016 | Bohr .................. H01L 29/4966 438/592 |
| 2018/0122709 A1 * | 5/2018 | Xie ........................ H01L 27/092 |
| 2020/0411662 A1 | 12/2020 | Lin et al. |

\* cited by examiner

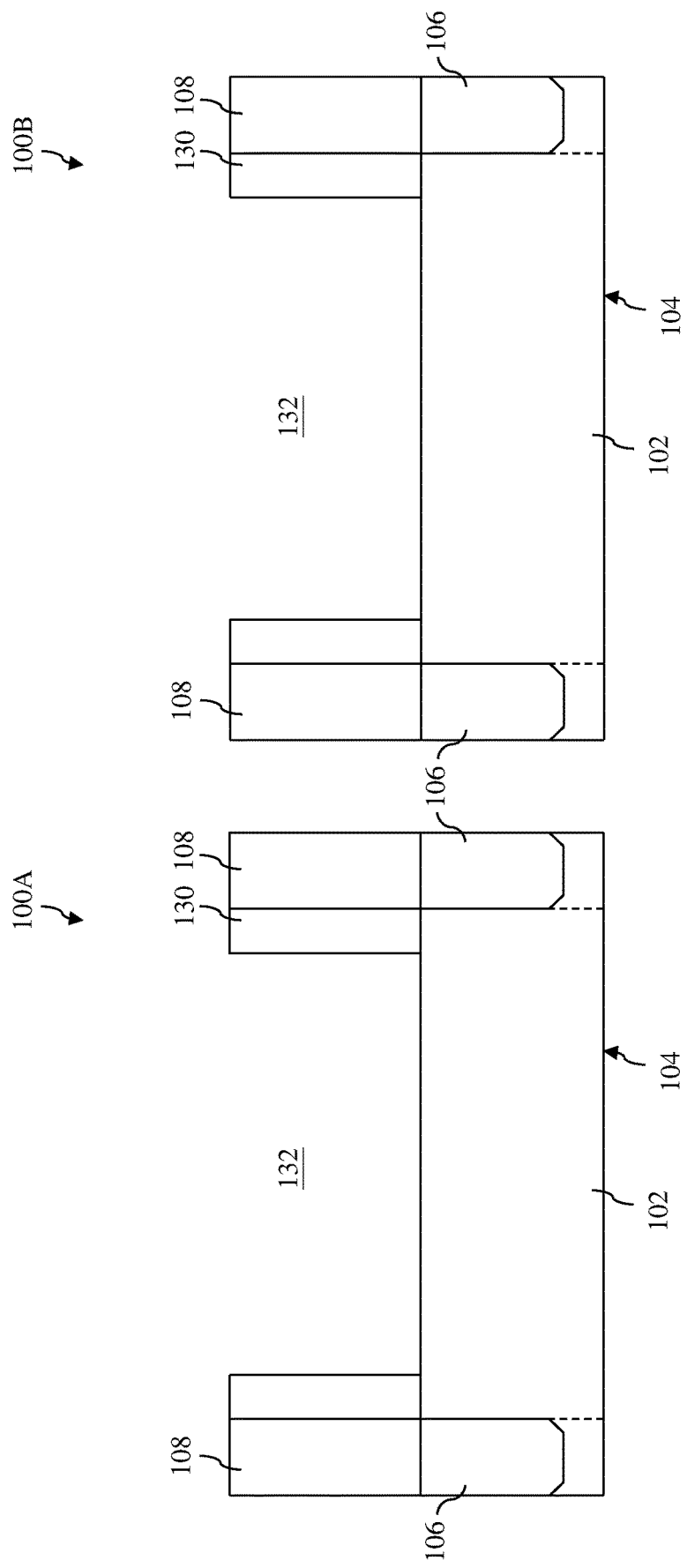

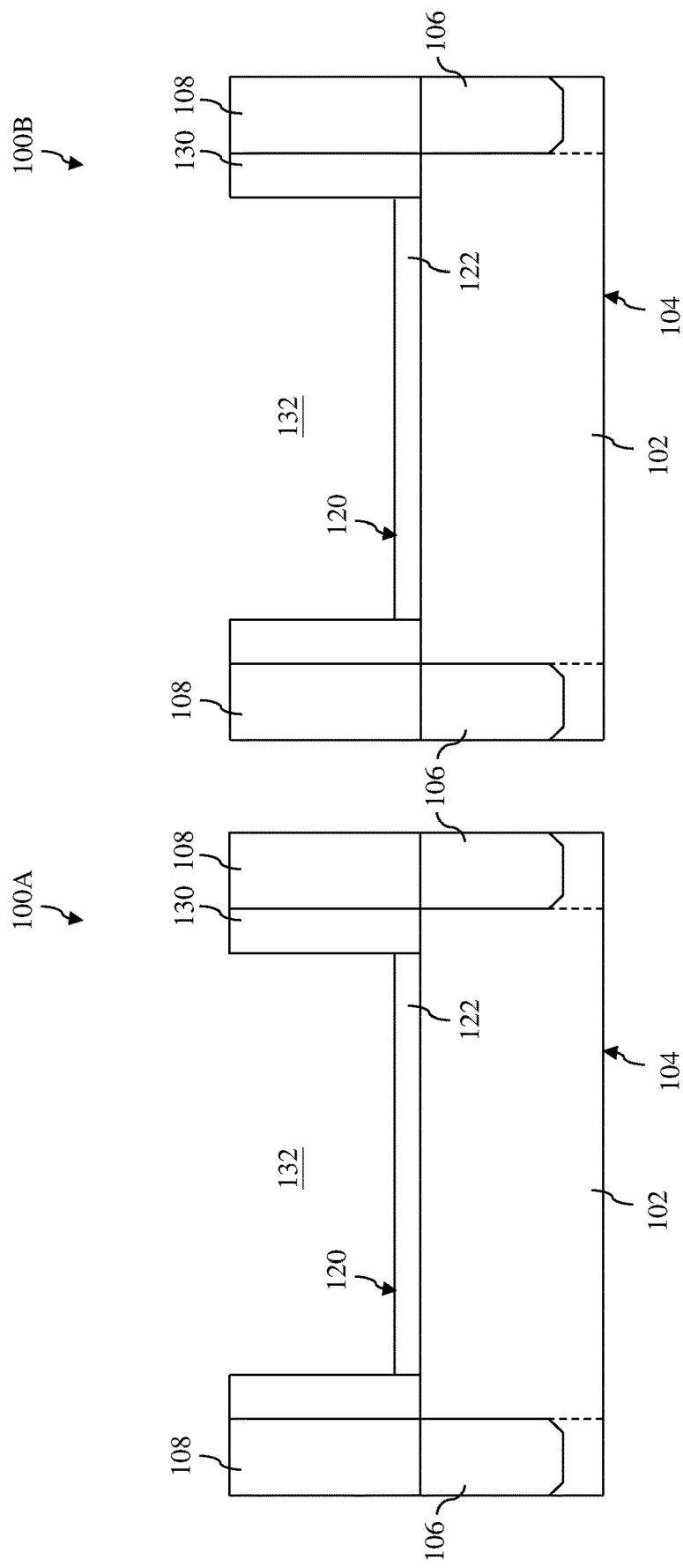

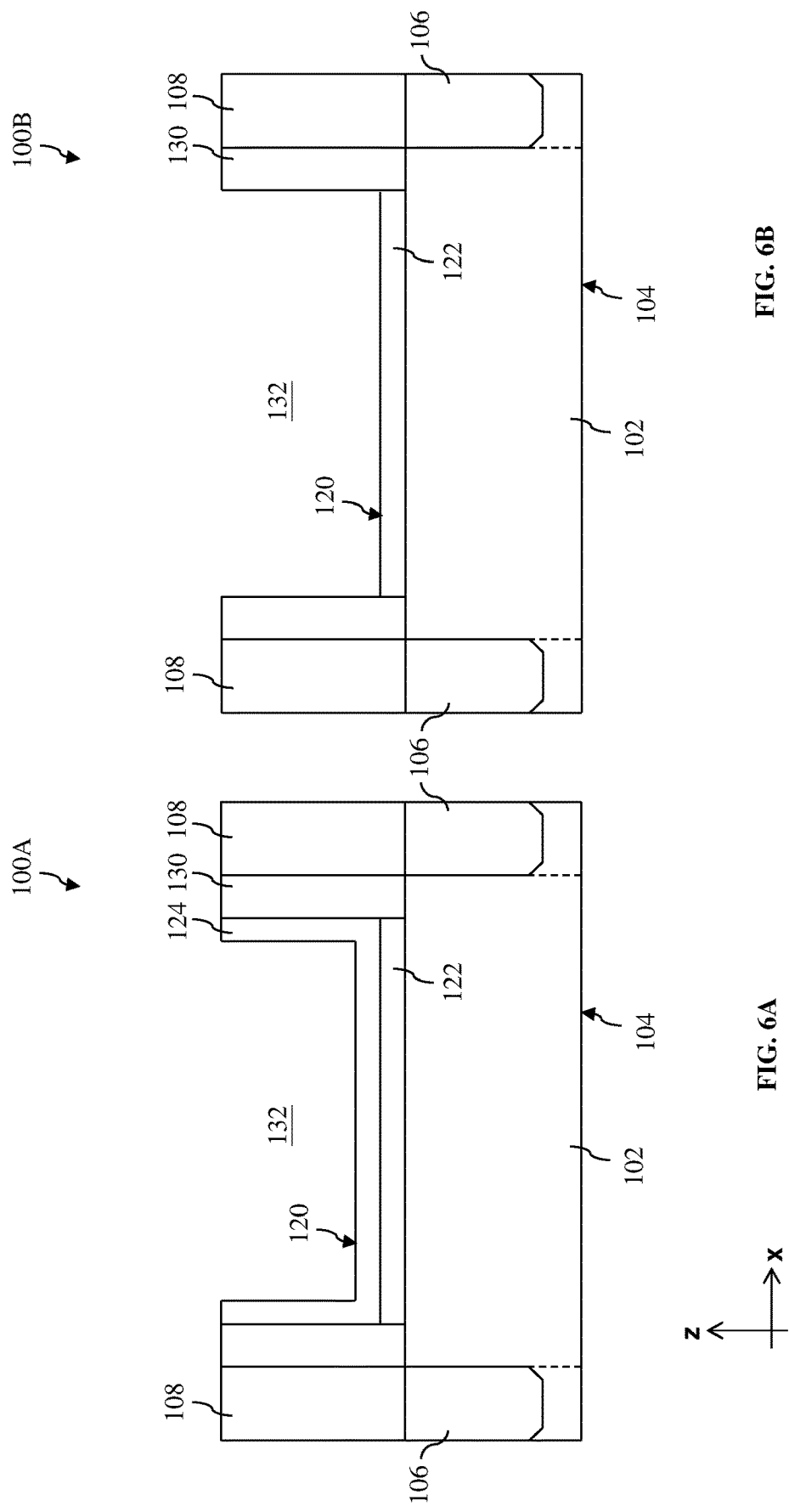

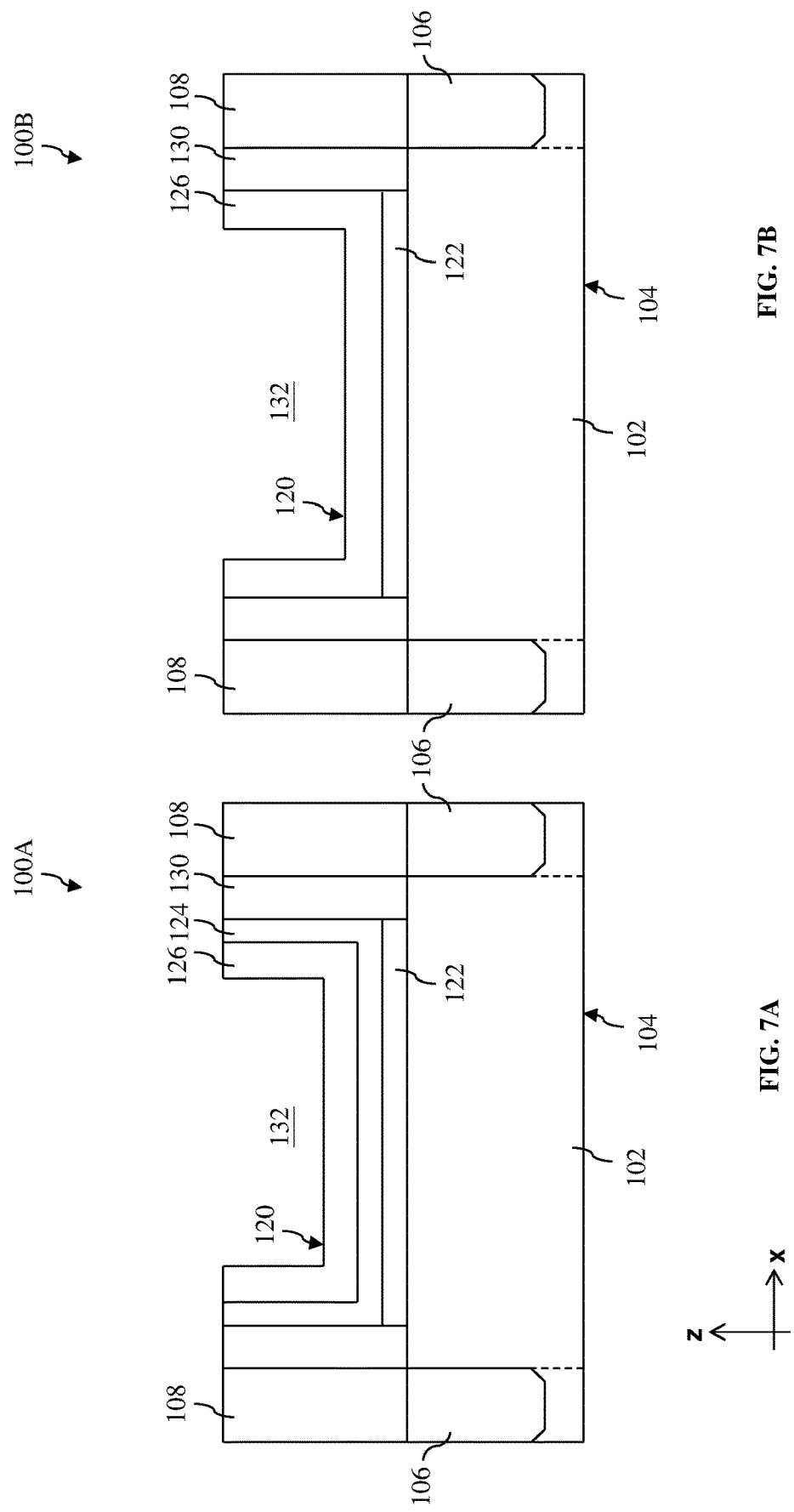

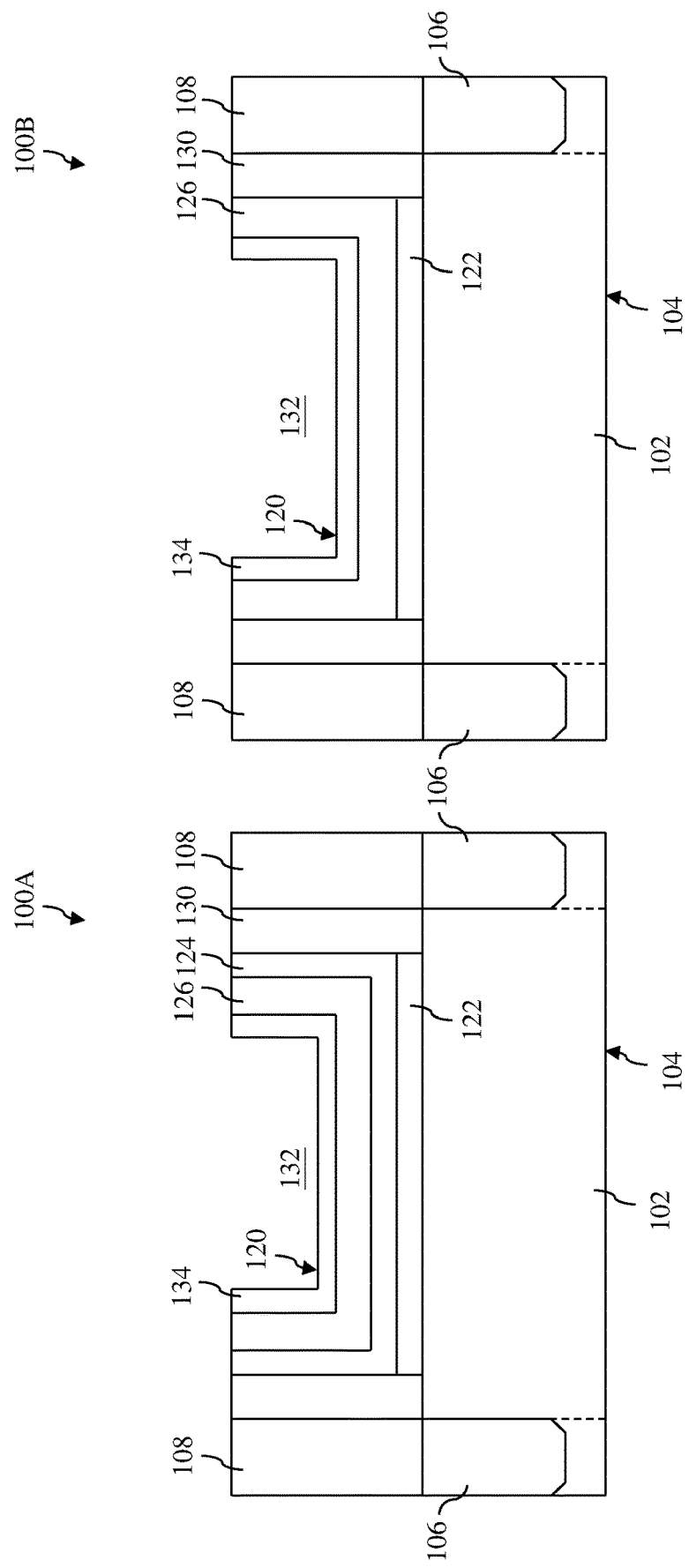

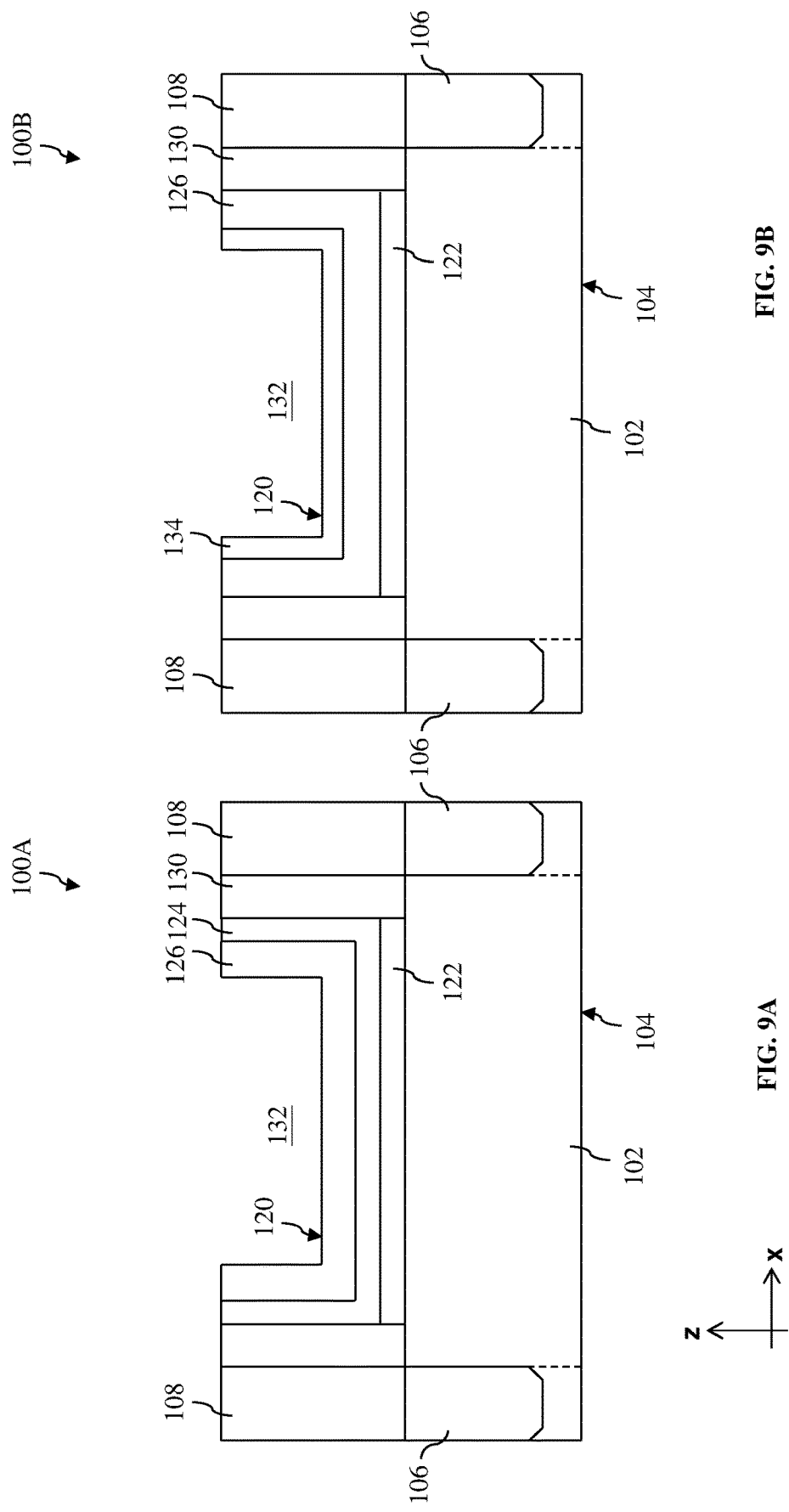

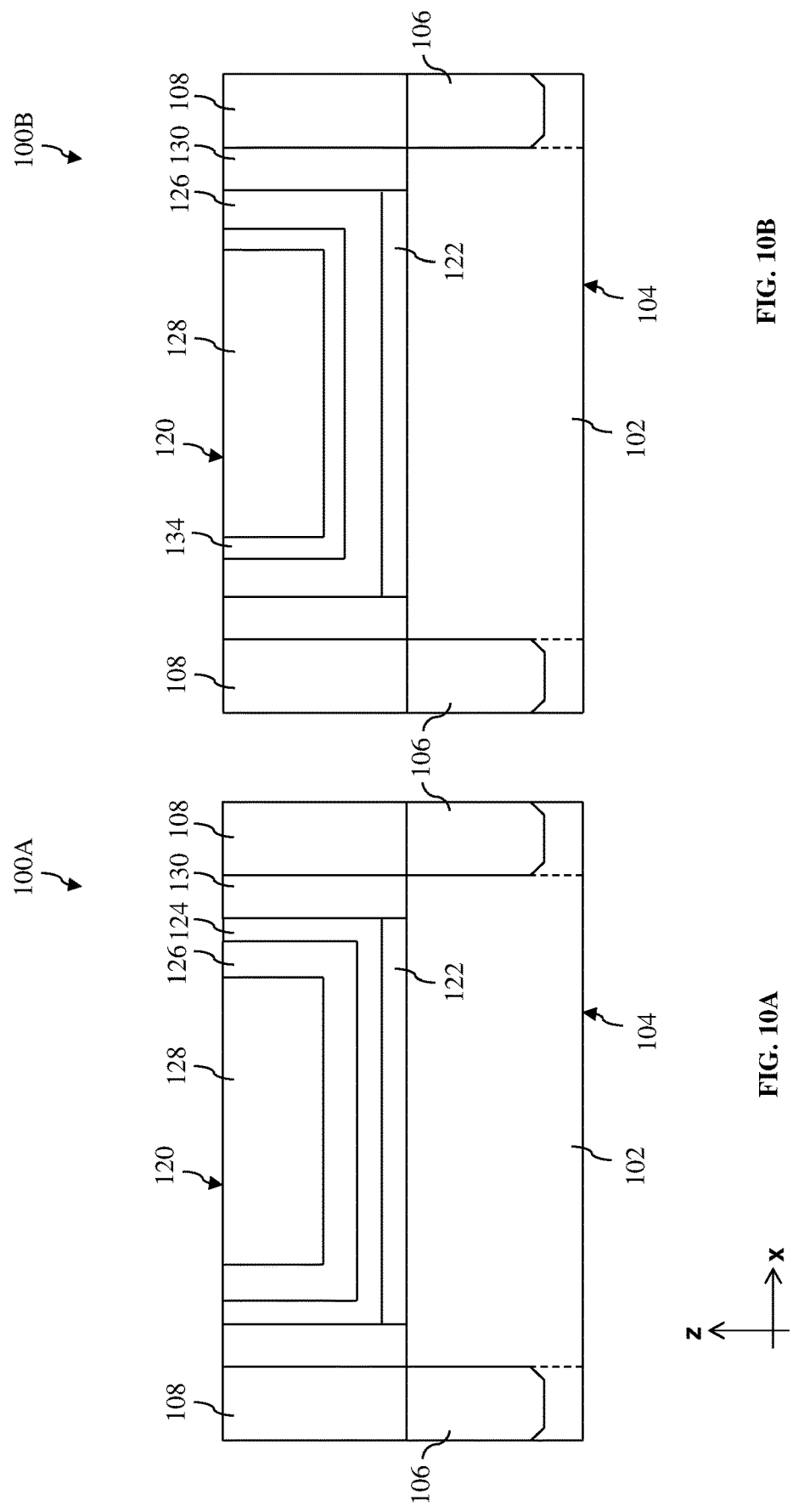

METAL OXIDE INTERLAYER STRUCTURE FOR NFET AND PFET

PRIORITY DATA

The present application is a Divisional of U.S. patent application Ser. No. 16/895,436, filed Jun. 8, 2020, which further claims the benefit of U.S. Provisional Application No. 62/894,200, entitled "Metal Oxide Interlayer Structure for nFET and pFET," filed Aug. 30, 2019, the entire disclosures of which are incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

One advancement implemented as technology nodes shrink, in some IC designs, such as Field-Effect Transistor (FET) designs, has involved the introduction and utilization of negative capacitance (NC) transistors. NC transistors add a ferroelectric material layer to conventional transistors to lower required supply voltage and reduce power consumption. NC-FETs may have issues with gate current density leakage, which may break NC behavior. Gate current leakage issues can be addressed with a thicker interfacial layer, but that, in turn, can degrade device performance due to large effective oxide thickness/inversion thickness. Furthermore, ferroelectric interface issues can cause NC-FETs to suffer from lower gain on pFET (e.g. with bottom interface being ferroelectric to dielectric and top interface being ferroelectric to metal). The gate current leakage and interface issues can detrimentally affect NC matching and deteriorate device performance. Therefore, how to improve performance of NC transistors is a challenge faced by the semiconductor industry. The present disclosure aims to solve the above issues and other related issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A-10A are sectional views of the nFET semiconductor structure of FIG. 1A at various stages of fabrication in accordance with some embodiments.

FIGS. 3B-10B are sectional views of the pFET semiconductor structure of FIG. 1B at various stages of fabrication in accordance with some embodiments.

DETAILED DESCRIPTION

Figure 1:
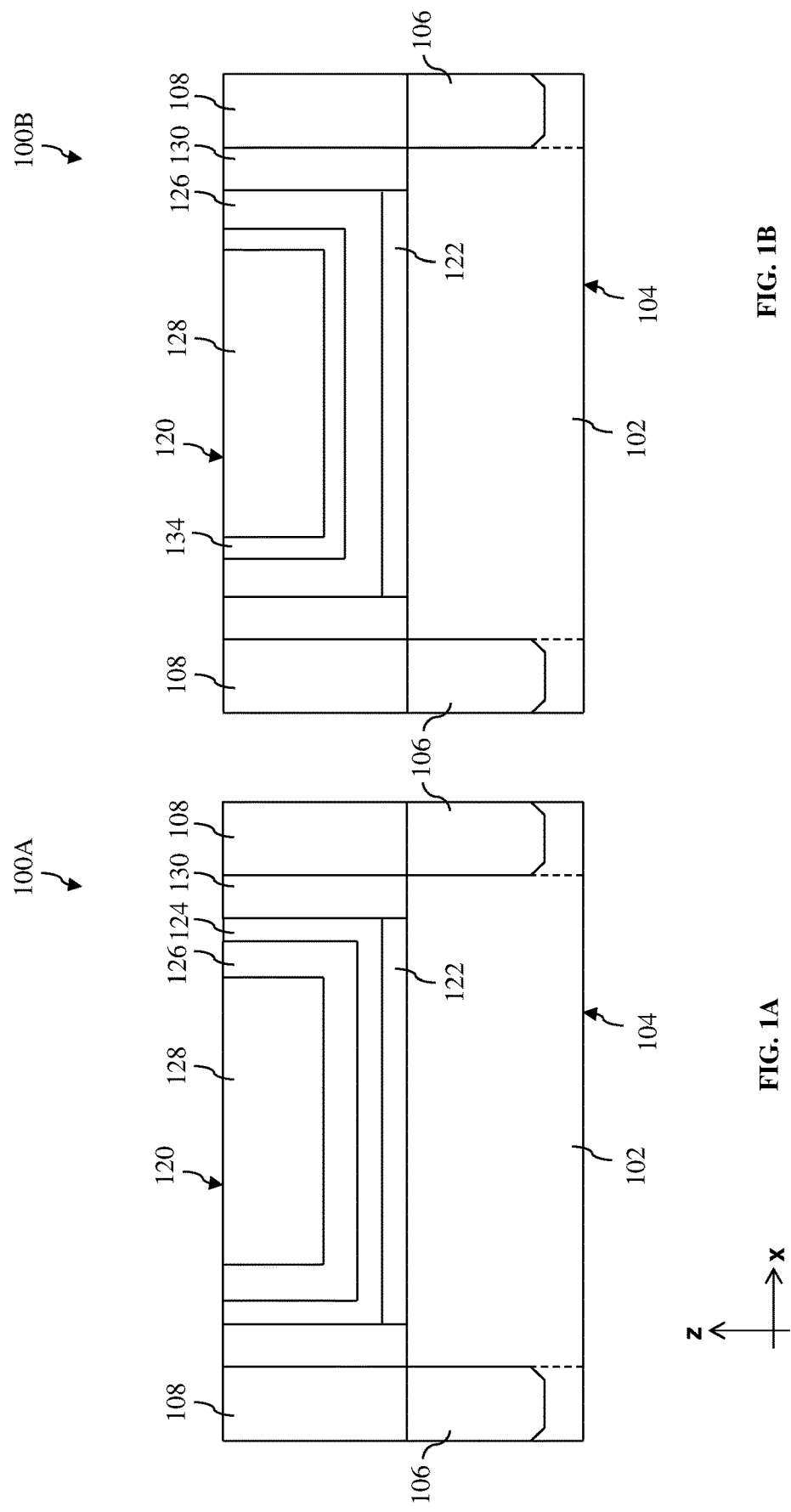
FIG. 1A is a sectional view of an nFET semiconductor structure constructed in accordance with some embodiments.
FIG. 1B is a sectional view of a pFET semiconductor structure constructed in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor device structures and fabrication methods. More particularly, the present disclosure is related to providing a metal oxide interlayer structure to address gate current leakage and interface issues in NC-FETs. In various embodiments, a thickness of the interfacial layer is approximately 5-8 Å. In some embodiments, the interfacial layer may have a thickness up to about 10 Å.

Referring to FIGS. 1A and 1B, an nFET semiconductor device structure 100A and a pFET semiconductor device structure 100B, respectively, are illustrated in accordance with some embodiments. Each of the semiconductor structures 100A, 100B includes a semiconductor substrate 102 having a channel region 104. Each of the semiconductor structures 100A, 100B includes source/drain (S/D) regions 106 disposed in the semiconductor substrate 102 on each side of the channel region 104. Each of the semiconductor structures 100A, 100B further includes a gate structure 120. The gate structure 120 includes an interfacial layer 122 disposed over the semiconductor substrate 102. Referring specifically to FIG. 1A, the nFET semiconductor structure 100A includes a first metal oxide layer 124 disposed over the interfacial layer 122 and a ferroelectric layer 126 disposed over the metal oxide layer 124. Referring instead to FIG. 1B, the pFET semiconductor structure 100B includes like material layers in a different order. More particularly, the pFET semiconductor structure 100B includes a ferroelectric layer 126 disposed over the interfacial layer 122 and a second metal oxide layer 134 disposed over the ferroelectric layer 126. Referring again to FIGS. 1A and 1B jointly, each of the semiconductor structures 100A, 100B includes a metal electrode 128 disposed over the foregoing layers of the gate structure 120. Each of the semiconductor structures 100A, 100B further includes gate spacers 130 disposed on sidewalls of the gate structure 120. Each of the semiconductor structures 100A, 100B further includes an interlayer dielectric (ILD) layer 108 disposed over the S/D regions 106 outside the channel region 104. The ILD layer 108 is adjacent to the gate spacers 130 on each side of the gate structure 120.

The semiconductor structures 100A, 100B may be formed by various methods 200, 300. The semiconductor structures 100A, 100B, especially the metal oxide interlayer structure, and the methods 200, 300 are further described below in detail. By implementing the semiconductor structures 100A, 100B and the methods 200, 300 of making same, the gate current leakage and interface issues are eliminated or reduced. In some embodiments, the metal oxide interlayer structure may reduce effective oxide thickness/inversion thickness. In some embodiments, NC matching and device performance are improved. In some embodiments, NC matching is improved for both nFET and pFET.

Figure 2:
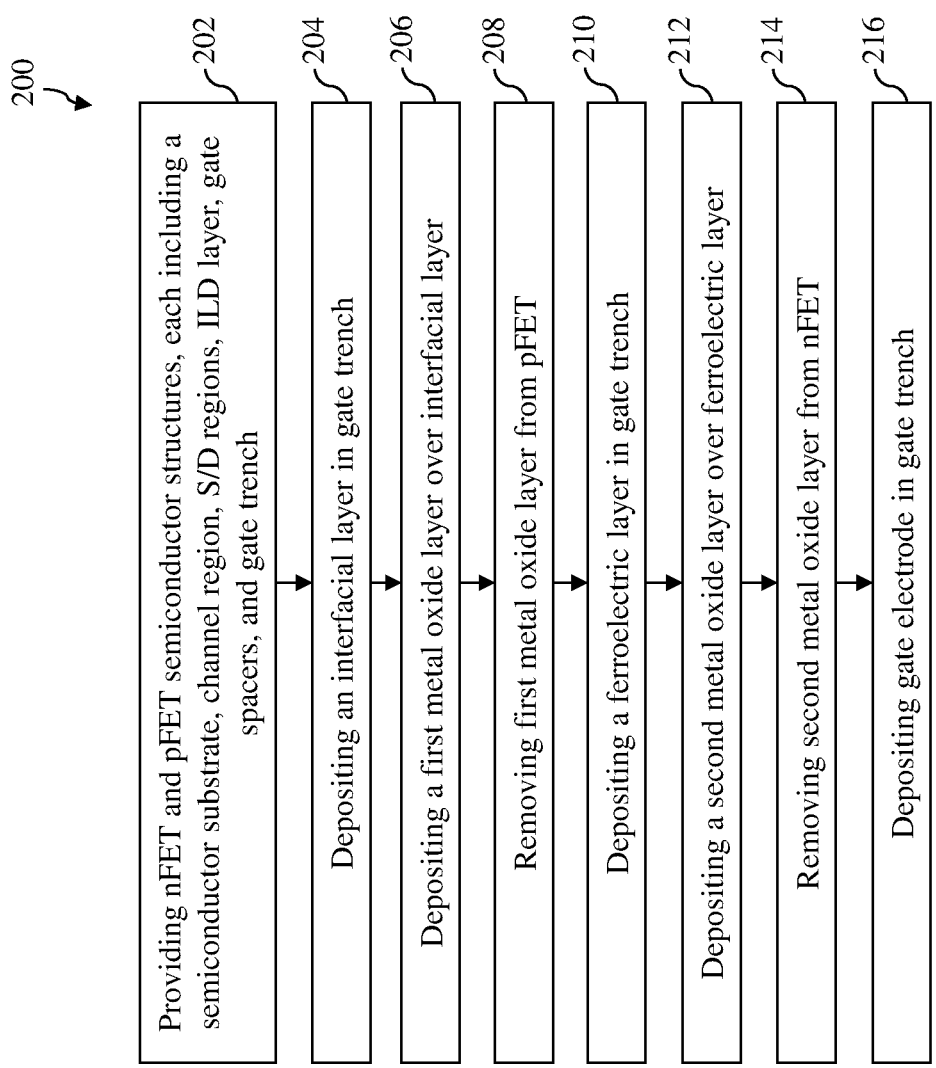
FIG. 2 is a flow chart of a method for forming the semiconductor structures of FIGS. 1A and 1B in accordance with some embodiments.

Referring to FIGS. 2, 3A, and 3B, the method 200 begins at operation 202 by providing an nFET semiconductor structure 100A and a pFET semiconductor structure 100B where each semiconductor structure 100 includes a semiconductor substrate 102 having a channel region 104, S/D regions 106, ILD layer 108, gate spacers 130, and gate trench 132. The operation 202 may incorporate detailed description of like structures from FIGS. 1A and 1B without limitation. In some embodiments, the semiconductor substrate 102 includes one or more fins extending lengthwise along the x-direction, each fin having a rectangular profile and protruding away from the substrate 102 in the z-direction.

In some embodiments, the substrate 102 is a silicon substrate. Alternatively, the substrate 102 may include another elementary semiconductor, such as germanium. The substrate 102 may also include a compound semiconductor including silicon carbide, gallium nitride, gallium arsenide, gallium phosphide, indium phosphide, indium arsenide, and indium antimonide. The substrate 102 may also include an alloy semiconductor including silicon germanium, gallium arsenide phosphide, aluminum indium phosphide, aluminum gallium arsenide, gallium indium arsenide, gallium indium phosphide, and gallium indium arsenide phosphide. In some embodiments, the substrate 102 may include an epitaxial layer. For example, the substrate 102 may have an epitaxial layer overlying a bulk semiconductor. The substrate 102 may be a wafer, such as a silicon wafer, and the substrate 102 may include one or more epitaxially grown semiconductor layers in an upper portion thereof. Furthermore, the substrate 102 may include a semiconductor-on-insulator (SOI) structure. For example, the substrate 102 may include a buried oxide (BOX) layer formed by a process such as separation by implanted oxygen (SIMOX) or other suitable technique, such as wafer bonding and grinding. In some other embodiments, the substrate 102 may include indium tin oxide (ITO) glass.

The S/D regions 106 are formed in the semiconductor substrate 102 on each side of the channel region 104. In other words, the channel region 104 is defined as a portion of the substrate 102 disposed between the S/D regions 106. The S/D regions 106 may be formed by one or more ion implantation processes, in which n-type or p-type dopant ions are implanted in the substrate 102, depending on the type of substrate 102 and the type of transistor desired (e.g., nFET or pFET). The S/D regions 106 may be formed separately for the nFET structure 100A and pFET structure 100B. For example, S/D regions 106 may be formed with n-type doped silicon for nFET structures 100A or with p-type doped silicon germanium for pFET structures 100B. In some embodiments, the S/D regions 106 are separated from adjacent doped features (e.g., other S/D regions of nearby transistors) by electrical isolation regions such as shallow trench isolation features.

The ILD layer 108 includes a dielectric material, such as a low-k dielectric material (a dielectric material with a dielectric constant smaller than that of silicon dioxide). As non-limiting examples, the low-k dielectric material may include fluorine-doped silicon dioxide, carbon-doped silicon dioxide, porous silicon dioxide, porous carbon-doped silicon dioxide, spin-on organic polymeric dielectrics, spin-on silicon based polymeric dielectrics, or combinations thereof. Alternatively, the ILD layer 108 may include silicon oxide or silicon nitride, or combinations thereof. In some other embodiments, the ILD layer 108 may include tetraethylorthosilicate (TEOS) oxide, undoped silicate glass, or doped silicon oxide such as borophosphosilicate glass (BPSG), fused silica glass (FSG), phosphosilicate glass (PSG), boron doped silicon glass (BSG), or other suitable dielectric materials. The ILD layer 108 may be formed by plasma-enhanced chemical vapor deposition (PECVD), flowable chemical vapor deposition (FCVD), or other suitable methods.

In some embodiments, each of semiconductor structures 100A, 100B includes a contact etch stop layer (not shown) between the S/D regions 106 and the ILD layer 108. The contact etch stop layer may include silicon nitride, silicon oxynitride, silicon nitride with oxygen or carbon elements, or other suitable materials and may be formed by chemical vapor deposition (CVD), physical vapor deposition (PVD), atomic layer deposition (ALD), or other suitable methods.

The gate spacer 130 may include a dielectric material, such as silicon oxide, silicon nitride, silicon oxynitride, silicon carbide, other dielectric material, or combinations thereof, and may include one or multiple layers of material. The gate spacer 130 may be formed by depositing a spacer material over a dummy gate (not shown). The spacer material may be etched by an anisotropic etching process. Portions of the spacer material that remain on sidewalls of the dummy gate after etching may become the gate spacer 130.

Referring to FIGS. 2, 4A, and 4B, the method 200 proceeds to operation 204 by depositing an interfacial layer 122 in the gate trench 132. The interfacial layer 122 provides an interface between the channel region 104 and the gate structure 120. The interfacial layer 122 may include silicon dioxide or silicon oxynitride. The interfacial layer 122 may be formed using chemical oxidation, thermal oxidation, ALD, CVD, or other suitable methods. In some embodiments, the thickness of the interfacial layer 122 may be approximately 5-8 Å. In some other embodiments, the thickness of the interfacial layer 122 may range from about 5 to 15 Å. A thickness of the interfacial layer below 5 Å increases gate current leakage while a thickness above 15 Å degrades device performance due to large effective oxide thickness/inversion thickness. In some embodiments, a thickness of the interfacial layer 122 may be less than or about equal to thicknesses of each of the first metal oxide layer 124, the second metal oxide layer 134, and the ferroelectric layer 126. In some other embodiments, a thickness of the interfacial layer 122 may be greater than thicknesses of each of the first metal oxide layer 124, the second metal oxide layer 134, and the ferroelectric layer 126.

Figures 5A, 5B:
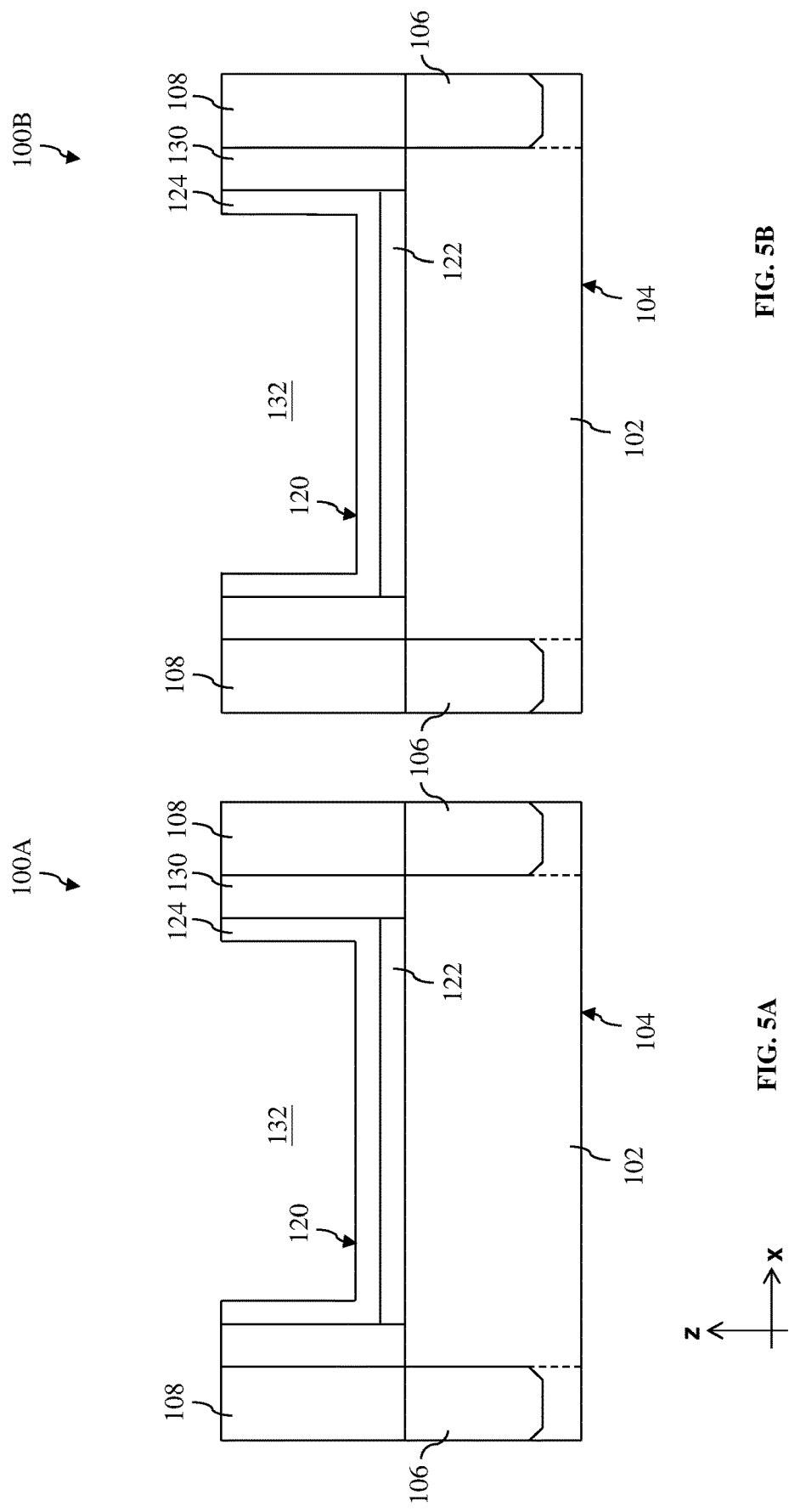

Referring to FIGS. 2, 5A, and 5B, the method 200 proceeds to operation 206 by depositing a first metal oxide layer 124 over the interfacial layer 122. In some embodiments, the first metal oxide layer 124 may be deposited over both the nFET and pFET semiconductor structures 100A, 100B. In some embodiments, the first metal oxide layer 124 may include a material having chemical formula $M_1O$, where $M_1$ is a metal. In some embodiments, the first metal oxide layer 124 may include $Al_2O_3$, $Ta_2O_5$, $La_2O_3$, $Y_2O_3$, $HfO_2$, $ZrO_2$, or combinations thereof. In some embodiments, the first metal oxide layer 124 may be amorphous, which may facilitate removal in a later step. In some embodiments, the first metal oxide layer 124 has thickness of about 2-10 Å. In some embodiments, the first metal oxide layer 124 has effective dielectric constant of about 10 or greater. In some embodiments, the first metal oxide layer 124 is deposited by CVD, PVD, PECVD, ALD, or other suitable methods.

Referring to FIGS. 2, 6A, and 6B, the method 200 proceeds to operation 208 by removing the first metal oxide layer 124 from the pFET semiconductor structure 100B. Removing the first metal oxide layer 124 may include forming a hard mask layer over each of the semiconductor structures 100A, 100B. In some embodiments, the hard mask layer may include SiO2. The removal process may further include forming a photoresist pattern over the nFET semiconductor structure 100A. The removal process may further include removing a portion of the hard mask layer covering the pFET semiconductor structure 100B using the photoresist pattern as an etch mask, thereby forming a patterned hard mask layer. The photoresist may be subsequently removed, for example, by ashing. The removal process may further include selectively removing the first metal oxide layer 124 from the pFET semiconductor structure 100B using the patterned hard mask layer as an etch mask. In some other embodiments, instead of the hard mask layer, the photoresist pattern may be formed directly on the nFET semiconductor structure 100A and used as an etch mask for the first metal oxide layer 124. In some embodiments, the first metal oxide layer 124 may be removed by wet cleaning using a wet solution including $H_2O_2$. In some embodiments, the wet cleaning process may also remove at least a portion of the interfacial layer 122 after substantially removing the first metal oxide layer 124. In some embodiments, a first thickness of the interfacial layer 122 before wet cleaning may be greater than 15 Å, and a second thickness of the interfacial layer 122 after wet cleaning may be about 5-8 Å. In some other embodiments, the second thickness may be as high as 10 Å. In some embodiments, the interfacial layer 122 may be thinned where a ratio of the first thickness to the second thickness is between about 3:2 and 3:1 of the first thickness. In some embodiments, the interfacial layer 122 may be thinned even more, such that the ratio may be greater than 3:1. A ratio of the first thickness to the second thickness less than 3:2 degrades device performance due to large effective oxide thickness/inversion thickness. In some embodiments, a ratio greater than 3:1 increases gate current leakage. In some embodiments, the thickness of the interfacial layer 122 may be tuned according to wet cleaning process time, such that longer process time may result in a thinner interfacial layer 122. In some embodiments, the first metal oxide layer 124 may be removed by isotropic etching such as, for example, by wet etching using a solution of hydrogen fluoride, low ammonium fluoride liquid, or other suitable solution. In some embodiments, the first metal oxide layer 124 may be removed by anisotropic etching such as, for example, by reactive ion etching. In some embodiments, the etching may selectively remove the first metal oxide layer 124 without affecting the interfacial layer 122.

Referring to FIGS. 2, 7A, and 7B, the method 200 proceeds to operation 210 by depositing a ferroelectric layer 126 in the gate trench 132. In some embodiments, the ferroelectric layer 126 may be deposited over both the nFET and pFET semiconductor structures 100A, 100B. In some embodiments, the ferroelectric layer 126 may include a material having chemical formula $M_2M_3O$, where $M_2$ is a metal and where $M_3$ may include an element, a metal different than $M_2$ or silicon. In some embodiments, the ferroelectric layer 126 may include HfZrOx, HfSiOx, HfAlOx, HfLaOx, or combinations thereof. In some embodiments, the ferroelectric layer 126 should be crystalline structure to improve performance since amorphous structure may degrade NC performance. In some embodiments, the ferroelectric layer 126 includes above ferroelectric material(s) having orthorhombic phase crystal structure. In some embodiments, being in orthorhombic phase may impart suitable ferroelectric properties to the ferroelectric layer 126. In some embodiments, the ferroelectric layer 126 has thickness of about 10-50 Å. This thickness lowers required supply voltage and reduces power consumption. In some implementations, performance of the ferroelectric layer 126 in NC transistors may be substantially constant throughout that range. In some embodiments, the ferroelectric layer 126 has effective dielectric constant of about 20 or greater. In some implementations, high dielectric constant, such as about 20 or greater, can reduce effective oxide thickness. In some embodiments, the ferroelectric layer 126 is deposited by ALD, which may help control thickness and uniformity of the ferroelectric layer 126. In some embodiments, the ferroelectric layer 126 is deposited at a temperature range from about 200° C. to about 400° C. In other embodiments, the ferroelectric layer 126 is deposited by CVD, PECVD, MOCVD, or PVD, or other suitable methods. In some other embodiments, the ferroelectric layer 126 may include PbZrTiOx, BaTiOx, or combinations thereof. In some other embodiments, the ferroelectric layer 126 may be doped with dopants using an implantation process or diffusion process. Dopants may include zirconium, silicon, aluminum, lead, barium, titanium, polymers for organic ferroelectric materials, or combinations thereof.

Referring to FIGS. 2, 8A, and 8B, the method 200 proceeds to operation 212 by depositing a second metal oxide layer 134 over the ferroelectric layer 126. In some embodiments, the second metal oxide layer 134 may be deposited over both the nFET and pFET semiconductor structures 100A, 100B. In some embodiments, the second metal oxide layer 134 may include a material having chemical formula $M_1O$, where $M_1$ is a metal. In some embodiments, the second metal oxide layer 134 may include $Al_2O_3$, $Ta_2O_5$, $La_2O_3$, $Y_2O_3$, $HfO_2$, $ZrO_2$, or combinations thereof. In some embodiments, the second metal oxide layer 134 has thickness of about 2-10 Å. In some embodiments, the second metal oxide layer 134 has effective dielectric constant of about 10 or greater. In some embodiments, the second metal oxide layer 134 may be deposited by CVD, PVD, PECVD, ALD, or other suitable methods.

Referring to FIGS. 2, 9A, and 9B, the method 200 proceeds to operation 214 by removing the second metal oxide layer 134 from the nFET semiconductor structure 100A. Removing the second metal oxide layer 134 may include forming a hard mask layer over each of the semiconductor structures 100A, 100B. In some embodiments, the hard mask layer may include $SiO_2$. The removal process may further include forming a photoresist pattern over the pFET semiconductor structure 100B. The removal process may further include removing a portion of the hard mask layer covering the nFET semiconductor structure 100A using the photoresist pattern as an etch mask, thereby forming a patterned hard mask layer. The photoresist may be subsequently removed, for example, by ashing. The removal process may further include selectively removing the second metal oxide layer 134 from the nFET semiconductor structure 100A using the patterned hard mask layer as an etch mask. In some other embodiments, instead of the hard mask layer, the photoresist pattern may be formed directly on the pFET semiconductor structure 100B and used as an etch mask for the second metal oxide layer 134. In some embodiments, the second metal oxide layer 134 may be removed by isotropic etching such as, for example, by wet etching using a solution of hydrogen fluoride, low ammonium fluoride liquid, or other suitable solution. In some embodiments, the second metal oxide layer 134 may be removed by anisotropic etching such as, for example, by reactive ion etching. In some embodiments, the etching may selectively remove the second metal oxide layer 134 without affecting the ferroelectric layer 126.

Referring to FIGS. 2, 10A, and 10B, the method 200 proceeds to operation 216 by depositing a gate electrode 128 in the gate trench 132. The gate electrode 128 may include one or more metal layers, such as work function metal layer(s), conductive barrier layer(s), and metal fill layer(s). The work function metal layer may be a p-type or an n-type work function layer depending on the type of device (pFET or nFET). The p-type work function layer may include a metal with sufficiently high effective work function, including without limitation titanium nitride (TiN), tantalum nitride (TaN), ruthenium (Ru), molybdenum (Mo), tungsten (W), platinum (Pt), or combinations thereof. The n-type work function layer may include a metal with sufficiently low effective work function, including without limitation titanium (Ti), aluminum (Al), tantalum carbide (TaC), tantalum carbide nitride (TaCN), tantalum silicon nitride (TaSiN), titanium silicon nitride (TiSiN), or combinations thereof. The metal fill layer may include aluminum (Al), tungsten (W), copper (Cu), cobalt (Co), or combinations thereof. The gate electrode 128 may be deposited by CVD, PVD, ALD, plating, or other suitable processes. The gate electrode 128 may also include one or more annealing processes. For example, in some embodiments, the work function metal layer and/or the metal fill layer may include a plurality of metal layers. In these embodiments, a respective annealing process may be performed after the deposition of each metal layer of the gate electrode 128.

Figure 11:
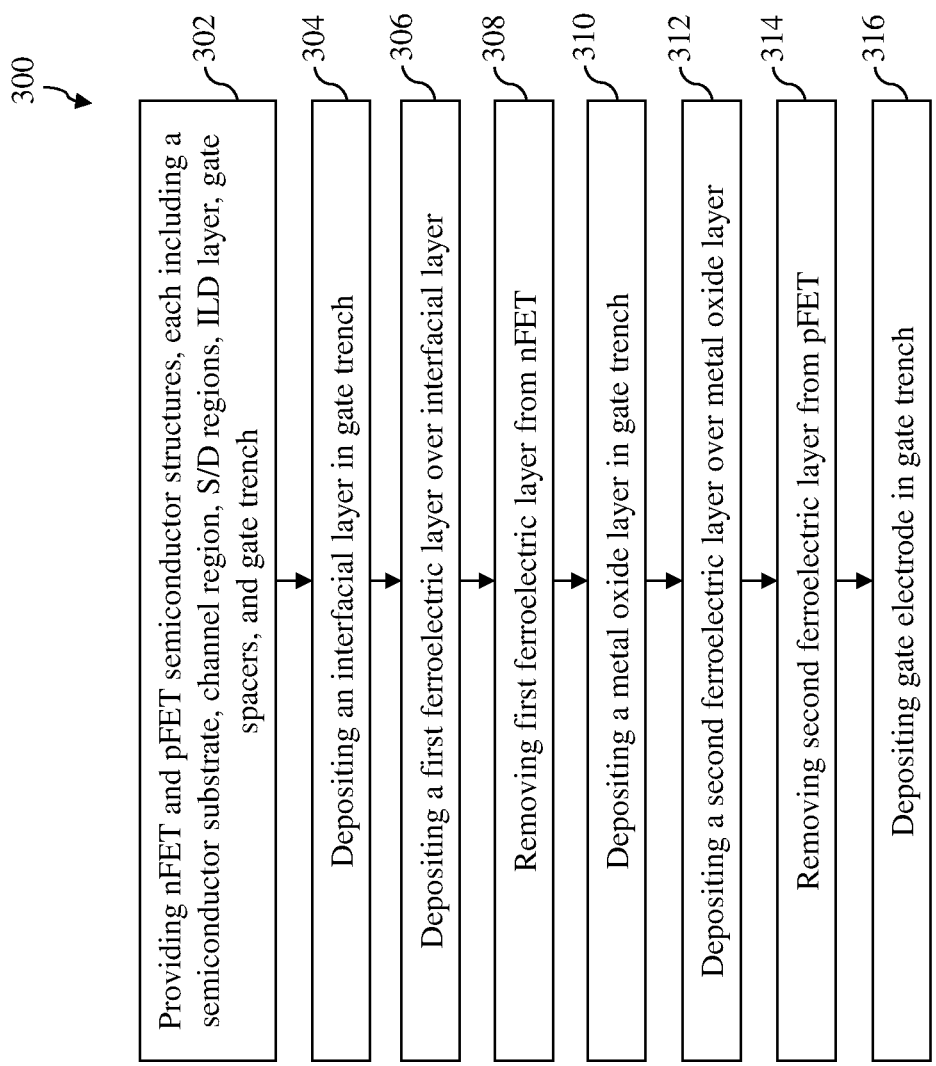
FIG. 11 is a flow chart of another method for forming the semiconductor structures of FIGS. 1A and 1B in accordance with some embodiments.

In some other embodiments, the semiconductor structures 100A, 100B may be formed using an alternative method 300 in place of the method 200. As described above, in part the method 200 includes depositing the first metal oxide layer 124 followed by removing a portion of the first metal oxide layer 124 from over the pFET semiconductor structure 100B. After depositing the ferroelectric layer 126, the method 200 includes depositing the second metal oxide layer 134 followed by removing a portion of the second metal oxide layer 134 from over the nFET semiconductor structure 100A. In contrast to the method 200, the method 300 includes steps of removing one or more ferroelectric layers instead of removing first and second metal oxide layers 124, 134. FIG. 11 is a flow chart of the method 300 for forming the semiconductor structures 100A, 100B in accordance with some embodiments.

Referring to FIG. 11, the method 300 begins at operation 302 by providing nFET and pFET semiconductor structures, each including a semiconductor substrate, channel region, S/D regions, ILD layer, gate spacers, and gate trench. The method 300 proceeds to operation 304 by depositing an interfacial layer in gate trench. The method 300 proceeds to operation 306 by depositing a first ferroelectric layer over interfacial layer. The method 300 proceeds to operation 308 by removing first ferroelectric layer from nFET. The method 300 proceeds to operation 310 by depositing a metal oxide layer in gate trench. The method 300 proceeds to operation 312 by depositing a second ferroelectric layer over metal oxide layer. The method 300 proceeds to operation 314 by removing second ferroelectric layer from pFET. In some embodiments, the first and second ferroelectric layers may be removed by wet cleaning using $H_2O_2$. In some embodiments, the first and second ferroelectric layers may be removed by isotropic etching such as, for example, by wet etching using a solution of hydrogen fluoride, low ammonium fluoride liquid, or other suitable solution. In some embodiments, the first and second ferroelectric layers may be removed by anisotropic etching such as, for example, by reactive ion etching. The method 300 proceeds to operation 316 by depositing gate electrode in gate trench. It will be appreciated that the method 300 is similar to the method 200 incorporating various processes and materials thereof. As such, the method 300 may incorporate detailed description of like structures, materials, and processes from the method 200 without limitation.

In some other embodiments, the semiconductor structures 100A, 100B may be formed without removing either of the one or more metal oxide layers or ferroelectric layers. Instead of depositing the one or more metal oxide layers or ferroelectric layers over the entire workpiece, which requires selective removal, the various layers may be selectively formed only on the nFET or pFET semiconductor structures 100A, 100B as needed using any suitable process.

Although not intended to be limiting, one or more embodiments of the present disclosure provide many benefits to a semiconductor device and the formation thereof. For example, embodiments of the present disclosure provide a metal oxide interlayer structure to address gate current leakage and interface issues in NC-FETs.

In one exemplary aspect, the present disclosure is directed to a method. The method includes providing an nFET structure and a pFET structure, each of the nFET and pFET structures including a semiconductor substrate and a gate trench; depositing an interfacial layer in each gate trench; depositing a first metal oxide layer over the interfacial layer; removing the first metal oxide layer from the pFET structure; depositing a ferroelectric layer in each gate trench; depositing a second metal oxide layer over the ferroelectric layer; removing the second metal oxide layer from the nFET structure; and depositing a gate electrode in each gate trench.

In another exemplary aspect, the present disclosure is directed to a semiconductor structure. The semiconductor structure includes a semiconductor substrate having a channel region; first and second S/D regions disposed in the semiconductor substrate on each side of the channel region; and a gate structure including: an interfacial layer over the channel region; a metal oxide layer above the interfacial layer; and a ferroelectric layer above the interfacial layer, wherein the metal oxide layer and the ferroelectric layer have different material composition.

In another exemplary aspect, the present disclosure is directed to a semiconductor structure. The semiconductor structure includes an nFET structure having a first channel region and a first gate structure, the first gate structure including: a first interfacial layer over the first channel region; a first metal oxide layer over the first interfacial layer, the first metal oxide layer having a first chemical composition; a first ferroelectric layer over the first metal oxide layer, the first ferroelectric layer having a second chemical composition different than the first chemical composition; and a first gate electrode over the first ferroelectric layer; and a pFET structure having a second channel region and a second gate structure, the second gate structure including: a second interfacial layer over the second channel region; a second ferroelectric layer over the second interfacial layer, the second ferroelectric layer having the second chemical composition; a second metal oxide layer over the second ferroelectric layer, the second metal oxide layer having the first chemical composition; and a second gate electrode over the second metal oxide layer.

In another exemplary aspect, the present disclosure is directed to an nFET semiconductor structure. The semiconductor structure includes a semiconductor substrate having a channel region; first and second S/D regions disposed in the semiconductor substrate on each side of the channel region; and a gate structure including an interfacial layer over the channel region; a metal oxide layer over the interfacial layer; a ferroelectric layer over the metal oxide layer; and a gate electrode over the ferroelectric layer.

In yet another exemplary aspect, the present disclosure is directed to a pFET semiconductor structure. The semiconductor structure includes a semiconductor substrate having a channel region; first and second S/D regions disposed in the semiconductor substrate on each side of the channel region; and a gate structure including an interfacial layer over the channel region; a ferroelectric layer over the interfacial layer; a metal oxide layer over the ferroelectric layer; and a gate electrode over the metal oxide layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   an nFET structure having a first channel region and a first gate structure, the first gate structure including:
   a first interfacial layer over the first channel region;
   a first metal oxide layer over the first interfacial layer, the first metal oxide layer having a first chemical composition;
   a first ferroelectric layer over the first metal oxide layer, the first ferroelectric layer having a second chemical composition different than the first chemical composition; and
   a first gate electrode over the first ferroelectric layer; and
   a pFET structure having a second channel region and a second gate structure, the second gate structure including:
   a second interfacial layer over the second channel region;
   a second ferroelectric layer over the second interfacial layer, the second ferroelectric layer having the second chemical composition;
   a second metal oxide layer over the second ferroelectric layer, the second metal oxide layer having the first chemical composition; and
   a second gate electrode over the second metal oxide layer.

2. The semiconductor structure of claim 1, wherein each of the first and second metal oxide layers includes a material selected from the group consisting of $Al_2O_3$, $Ta_2O_5$, $La_2O_3$, $Y_2O_3$, $HfO_2$, and $ZrO_2$.

3. The semiconductor structure of claim 1, wherein each of the first and second metal oxide layers is amorphous.

4. The semiconductor structure of claim 1, wherein each of the first and second metal oxide layers has a thickness of about 2-10 Å.

5. The semiconductor structure of claim 1, wherein each of the first and second metal oxide layers has a dielectric constant of about 10 or greater.

6. The semiconductor structure of claim 1, wherein each of the first and second ferroelectric layers includes a material selected from the group consisting of HfZrOx, HfSiOx, HfAlOx, and HfLaOx.

7. The semiconductor structure of claim 1, wherein each of the first and second ferroelectric layers includes one of PbZrTiOx and BaTiOx.

8. The semiconductor structure of claim 1, wherein each of the first and second ferroelectric layers is further doped with a dopant selected from the group consisting of zirconium, silicon, aluminum, lead, barium, titanium, polymers for organic ferroelectric materials, and combinations thereof.

9. The semiconductor structure of claim 1, wherein the first and second metal oxide layers each include a first material having chemical formula $M_1O$, and wherein the first and second ferroelectric layers each include a second material different from the first material, the second material having chemical formula $M_2M_3O$, wherein $M_1$ is a first metal, $M_2$ is a second metal, $M_3$ is an element, and O represents oxygen.

10. A semiconductor structure, comprising:
    an nFET structure having a first gate structure over a first channel region of a substrate, the first gate structure having: a first interfacial layer over the first channel region, a first metal oxide layer, and a first ferroelectric layer, wherein the first metal oxide layer is disposed between the first interfacial layer and the first ferroelectric layer; and
    a pFET structure having a second gate structure over a second channel region of the substrate, the second gate structure having: a second interfacial layer over the second channel region, a second metal oxide layer, and a second ferroelectric layer, wherein the second ferroelectric layer is disposed between the second interfacial layer and the second metal oxide layer,
    wherein the first and second metal oxide layers each include a first material having chemical formula $M_1O$, and wherein the first and second ferroelectric layers each include a second material different from the first material, the second material having chemical formula $M_2M_3O$, wherein $M_1$ is a first metal, $M_2$ is a second metal, $M_3$ is an element, and O represents oxygen.

11. The semiconductor structure of claim 10, wherein each of the first and second gate structures further includes a first and a second gate electrode, respectively.

12. The semiconductor structure of claim 10, wherein each of the first and second metal oxide layers has an amorphous structure.

13. The semiconductor structure of claim 12, wherein each of the first and second ferroelectric layers has a crystalline structure.

14. The semiconductor structure of claim 10, wherein each of the first and second metal oxide layers has a dielectric constant of about 10 or greater.

15. The semiconductor structure of claim 14, wherein each of the first and second ferroelectric layers has a dielectric constant greater than the dielectric constant of each of the first and second metal oxide layers.

16. The semiconductor structure of claim 14, wherein each of the first and second ferroelectric layers has a dielectric constant of about 20 or greater.

17. A semiconductor structure, comprising:
an nFET structure having a first channel region and a first gate structure, the first gate structure including:
a first interfacial layer over the first channel region;
a first metal oxide layer directly on the first interfacial layer;
a first ferroelectric layer thicker than the first metal oxide layer over the first metal oxide layer; and
a first gate electrode over the first ferroelectric layer; and
a pFET structure having a second channel region and a second gate structure, the second gate structure including:
a second interfacial layer over the second channel region;
a second ferroelectric layer directly on the second interfacial layer;
a second metal oxide layer thinner than the second ferroelectric layer over the second ferroelectric layer; and
a second gate electrode over the second metal oxide layer.

18. The semiconductor structure of claim 17, wherein each of the first and second metal oxide layers includes a material selected from the group consisting of $Al_2O_3$, $Ta_2O_5$, $La_2O_3$, $Y_2O_3$, $HfO_2$, and $ZrO_2$.

19. The semiconductor structure of claim 18, wherein each of the first and second ferroelectric layers includes a material selected from the group consisting of HfZrOx, HfSiOx, HfAlOx, and HfLaOx.

20. The semiconductor structure of claim 18, wherein each of the first and second ferroelectric layers includes one of PbZrTiOx and BaTiOx.

* * * * *